(12) United States Patent
Kerber et al.

(10) Patent No.: US 7,403,026 B2
(45) Date of Patent: Jul. 22, 2008

(54) ELECTRONIC SWITCHING CIRCUIT, SWITCHING CIRCUIT TEST ARRANGEMENT AND METHOD FOR DETERMINING THE OPERATIVENESS OF AN ELECTRONIC SWITCHING CIRCUIT

(75) Inventors: Martin Kerber, Müchen (DE); Thomas Pompl, Landshut (DE)

(73) Assignee: Infineon Technologies AG, Munich (DE)

( * ) Notice: Subject to any disclaimer, the term of this patent is extended or adjusted under 35 U.S.C. 154(b) by 113 days.

(21) Appl. No.: 11/377,516

(22) Filed: Mar. 16, 2006

(65) Prior Publication Data
US 2006/0282725 A1    Dec. 14, 2006

Related U.S. Application Data

(63) Continuation of application No. PCT/DE2004/001879, filed on Aug. 24, 2004.

(30) Foreign Application Priority Data
Sep. 17, 2003   (DE) .............................. 103 42 997

(51) Int. Cl.
*G01R 31/02*   (2006.01)
(52) U.S. Cl. .................... 324/763; 324/765; 326/16; 327/365
(58) Field of Classification Search ............ 326/16, 326/81, 83; 324/763, 765; 327/365
See application file for complete search history.

(56) References Cited

U.S. PATENT DOCUMENTS

| 4,339,710 A | 7/1982 | Hapke |
| 4,959,812 A | 9/1990 | Momodomi et al. |
| 5,768,290 A * | 6/1998 | Akamatsu .................... 714/732 |
| RE35,838 E | 7/1998 | Momodomi et al. |
| 6,046,627 A * | 4/2000 | Itoh et al. .................... 327/546 |
| 6,097,113 A * | 8/2000 | Teraoka et al. ............... 307/125 |
| 6,307,234 B1 * | 10/2001 | Ito et al. ...................... 257/371 |
| 6,778,002 B2 * | 8/2004 | Miyazaki et al. ............. 327/534 |
| 7,154,133 B1 * | 12/2006 | Koyama ....................... 257/207 |
| 2001/0045841 A1 | 11/2001 | Kondo et al. |
| 2002/0008999 A1 * | 1/2002 | Hidaka ......................... 365/200 |

FOREIGN PATENT DOCUMENTS

DE    29 05 271 A1    8/1980

(Continued)

OTHER PUBLICATIONS

B. Kaczer et al., "Impact of MOSFET oxide breakdown on digital circuit operation and reliability", *IEDM 00*, 2000, month unknown.

(Continued)

*Primary Examiner*—Vibol Tan
(74) *Attorney, Agent, or Firm*—Brinks Hofer Gilson & Lione (57) ABSTRACT

The invention relates to an electronic switching circuit in which a plurality of test circuit blocks is provided, whereby every test circuit block comprises a first sub-circuit block and at least one second sub-circuit block. A field effect transistor in the first sub-circuit block has a gate insulation layer that is thicker than the gate insulation layer of a field effect transistor in the second sub-circuit block.

17 Claims, 4 Drawing Sheets

FOREIGN PATENT DOCUMENTS

DE    38 86 722 T2    4/1994

OTHER PUBLICATIONS

B. Kaczer et al., "Impact of MOSFET Gate Oxide Breakdown on Digital Circuit Operation and Reliability", *IEEE Transactions on Electron Devices*, vol. 49, No. 3, Mar. 2002.

B. Kaczer et al., "Observation of hot-carrier-induced nFET gate-oxide breakdown in dynamically stressed CMOS circuits", *IEDM Tech. Dig.*, 2002, month unknown.

B. P. Linder, "Transistor-Limited Constant Voltage Stress of Gate Dielectrics", *Symposium on VLSI Technology Digest of Technical Papers*, 2001, month unknown.

R. Rodriguez et al., "The Impact of Gate-Oxide Breakdown On SRAM Stability", *IEEE Electron Device Letters*, vol. 23, No. 9, Sep. 2002.

R. Rodriguez et al., "A Model For Gate-Oxide Breakdown in CMOS in Inverters", *IEEE Electron Device Letters*, vol. 24, No. 2, Feb. 2003.

\* cited by examiner

ELECTRONIC SWITCHING CIRCUIT, SWITCHING CIRCUIT TEST ARRANGEMENT AND METHOD FOR DETERMINING THE OPERATIVENESS OF AN ELECTRONIC SWITCHING CIRCUIT

PRIORITY CLAIM

This application is a continuation of PCT patent application No. PCT/DE2004/001879, filed Aug. 24, 2004, which claims the benefit of priority to German Patent Application No. DE 10342997.2, filed Sep. 17, 2003, both of which are incorporated herein by reference.

TECHNICAL FIELD

The invention relates to an electronic switching circuit, a switching circuit test arrangement and a method for determining the operativeness of an electronic switching circuit.

BACKGROUND

The reliability of a gate oxide in an integrated semiconductor component comprising a field effect transistor encounters intrinsic loading limits as scaling progresses, in particular with development of transistors having ever thinner layers and rising operating field strengths despite lower operating voltages.

The statistical nature of the dielectric breakdown of a gate oxide leads to a wider statistical variation of the lifetime of the respective semiconductor component. This means that, particularly when there is a large active area of an electronic chip, as a result of area scaling, the prognosticated lifetime of the semiconductor components is reduced and can no longer be predicted reliably.

Moreover, in the case of a thin dielectric, a dielectric breakdown is characterized by a significantly smaller rise in the leakage current than in the case of a thicker dielectric layer. In many circuitry applications, the only small rise in the leakage current leads merely to an increase in the power loss in the electronic circuit, but not necessarily to a malfunction, that is to say to a failure of the entire electronic circuit.

Customary test methods for testing an electronic circuit assess the first small alteration of the gate current flowing through the gate oxide, but not the actually relevant malfunction of the electronic circuit or of the electronic switching circuit in the respectively relevant switching circuit environment.

Furthermore, it is known to determine the reliability of a dielectric by means of accelerated test methods on a test structure having a parallel circuit formed by a plurality of identical basic elements. In the case of a thin dielectric, the maximum number of basic elements is limited by the high leakage current that occurs on account of direct tunneling and the small breakdown current.

A breakdown event must lead to a significant current rise above the basic level of the loading current of the electronic switching circuit, also referred to hereinafter as the stress current of the electronic switching circuit, in order to be identified sufficiently dependably.

In the case of a dielectric having a thickness of 2.0 nm, the maximum active area of the entire test structure is restricted to 200 µm² to 1000 µm² in accordance with the prior art.

The area limitation that occurs for a test structure leads to a significantly restricted resolution of the defect density and, associated with this, to an increased uncertainty in an extrapolation to reliability requirements (reliability targets) under operating conditions of an electronic switching circuit.

Improving the resolution of the defect density leads to a considerable additional expenditure in the form of required measurement time and/or required equipment for the parallel measurement.

Articles by Kazer et al. describe that, in the case of a thin gate oxide in the case of transistors in an electronic switching circuit, the failure of one or more transistors in the electronic switching circuit on account of a breakdown occurring in the respective gate oxide of a field effect transistor need not yet necessarily lead to the failure of the operativeness of the entire electronic switching circuit compared with the desired function of the electronic switching circuit. (B. Kaczer et al., Impact of MOSFET gate oxide breakdown on digital circuit operation and reliability, IEEE Transactions on Electron Devices, Volume 49, No. 3, pages 500 to 505, March 2002). (B. Kaczer et al., Impact of MOSFET oxide breakdown on digital circuit operation and reliability, IEDM 00, pages 553 to 556, 2000).

The Kazer et al. articles describe in this context a ring oscillator structure comprising 47 inverters connected to form a ring, an inverter being embodied as a NAND gate. A frequency divider switching circuit is connected downstream of the ring oscillator. The switching circuit arrangement comprising ring oscillator and frequency divider switching circuit would be exposed to a loading by application of an electrical voltage and the behavior of the function of the switching circuit arrangement would be examined.

An article by R. Rodriguez et al. describes the influence of a gate oxide breakdown in the case of a field effect transistor in an SRAM memory cell (Static Random Access Memory cell). (R. Rodriguez et al, The impact of gate-oxide breakdown on SRAM stability, IEEE Electron Device Letters, Volume 23, No. 9, pages 559 to 561, September 2002).

Furthermore, an additional article by R. Rodriguez et al. discloses that in the case of an inverter which has an NMOS field effect transistor and a PMOS field effect transistor and is loaded by a voltage, the degradation of the inverter dependent on the polarity of the applied stress voltage. Depending on the polarity of the applied stress voltage, either the respective NMOS field effect transistor or the respective PMOS transistor is loaded to a greater extent and destroyed earlier. (R. Rodriguez et al, A model for gate-oxide breakdown in CMOS in Inverters, IEEE Electron Device Letters, Volume 24, No. 2, pages 114 to 116, February 2003).

Furthermore, an article by B. P. Linder describes an NMOS field effect transistor to be tested, with a gate oxide having a layer thickness of 1.7 nm, to the gate terminal of which is connected a PMOS field effect transistor with a thicker gate oxide. The stress voltage is applied to the drain terminal of the PMOS field effect transistor. (B. P. Linder, Transistor-Limited constant voltage stress of gate dielectrics, Symposium on VLSI Technology Digest of Technical Papers, pages 93 to 94, 2001).

In the case of the circuit comprising two field effect transistors as described by B. P. Linder, given a stress voltage of 3.4 volts and a current driver capability of less than 200 µA, a leakage current that was lower than 100 µA was measured after the gate oxide had undergone breakdown in the NMOS field effect transistor. It should be noted in this context that only the behavior of the gate oxide in the NMOS field effect transistor was examined in isolated fashion upon application of the stress voltage to the PMOS field effect transistor.

German patent No. DE 29 05 271 A1 discloses an integrated circuit arrangement using MOS technology comprising field effect transistors, which has a circuit arrangement for rapidly testing different blocks of the switching circuit. Said circuit arrangement has three transistor switch groups. A first transistor switch group is used for testing an input block. A second transistor switch group serves for turning on and turning off the input block and an output block so that the blocks can be tested jointly and a third block for testing the output block.

German patent No. DE 38 86 722 T2 discloses an electrically erasable and programmable read-only memory comprising a NAND cell structure, said memory having memory cells (M) arranged on an N-type substrate. The memory cells are divided into NAND cell blocks each having series-connected memory cell transistor arrays (M1 to M4). Each of the transistors has a floating gate (50), a control gate connected to a word line (WLi), and an N-type diffusion layer (68, 70), serving as corresponding sources and drains.

SUMMARY

The invention is based on the problem of determining the reliability of a gate insulation layer of a field effect transistor, a product-relevant statement with regard to the reliability of an electronic switching circuit which has the respective field effect transistor being made possible without being subjected to the restriction with regard to the area limitation as is given in accordance with the prior art.

The problem is solved by means of the electronic switching circuit, by means of the switching circuit test arrangement and also by means of the method for determining the operativeness of an electronic switching circuit comprising the features in accordance with the independent patent claims.

An electronic switching circuit has a test signal input terminal for application of a test input signal. Furthermore, a test signal output terminal is provided, at which a test output signal can be provided. A multiplicity of test circuit blocks are connected between the test signal input terminal and the test signal output terminal, each test circuit block having at least one first sub-circuit block and at least one second sub-circuit block. This means that a test input signal applied to the test signal input terminal passes through the test circuit blocks according to the configuration thereof or is processed thereby in accordance with the functionality of the test circuit blocks and is provided as a test output signal on the output side at the test output terminal. It is thus ensured on account of the coupling of the test circuit blocks to the test signal input terminal on the input side and to the test signal output terminal on the output side that the functionality of the test circuit blocks can be tested by means of the test input signal. The first sub-circuit block of each test circuit block contains at least one first field effect transistor with a gate insulation layer. Furthermore, the second sub-circuit block of each test circuit block contains at least one second field effect transistor with a gate insulation layer. The gate insulation layer of the first field effect transistor is thicker than the gate insulation layer of the second field effect transistor.

A switching circuit test arrangement for determining the operativeness of an electronic switching circuit has the electronic switching circuit described above and also a test input signal generating unit for generating a test input signal to be fed to the test signal input terminal, and also a test output signal evaluation unit, by means of which the operativeness of the electronic switching circuit can be determined. Furthermore, provision is made of an operating voltage source for providing an operating voltage with which the electronic switching circuit is operated.

In a method for determining the operativeness of an electronic switching circuit constructed in the manner described above, a test input signal is applied to the test signal input terminal and the associated test output signal is tapped off at the test signal output terminal. The test output signal is used to determine whether or not the electronic switching circuit is operative.

In the case of the electronic switching circuit, on account of the multiplicity of test circuit blocks arranged one after the other, not just an individual transistor is checked with regard to its operativeness, rather the desired functional behavior of the totality of the test circuit blocks is tested. Product-relevant information with regard to the operativeness of a product comprising integrated semiconductor components is ensured in this way.

Furthermore, on account of the different thickness of the gate insulation layers in the respective sub-circuit blocks of the test circuit blocks, it is ensured that only the respective second field effect transistor, that is to say the field effect transistor with the thin gate insulation layer, is effectively tested and stressed with regard to a gate insulation layer breakdown and the gate insulation layer of the first field effect transistor, that is to say the field effect transistor with the thicker gate insulation layer, is itself not tested with regard to a possibly occurring gate insulation layer breakdown since the probability of a gate insulation layer breakdown is significantly lower in the case of the first field effect transistor than in the case of the second field effect transistor.

Clearly, the first field effect transistor thus represents a stress source, to put it another way, a driver for the second field effect transistor. In general, the first sub-circuit block represents a stress source or a driver for the second sub-circuit block.

The first field effect transistor, generally the first sub-circuit block, clearly serves for signal conditioning and only the second field effect transistor, clearly the second sub-circuit block, is tested with regard to the occurrence of a possible gate insulation layer breakdown.

In this way, the invention proposes a new test and/or assessment method with a corresponding test structure enabling a more realistic prognosis for the reliability of a dielectric, preferably of a gate dielectric of a field effect transistor. Consequently, what is achieved for the first time according to the invention is that an area limitation no longer exists in the context of determining the reliability of a gate insulation layer. Furthermore, on account of the multiplicity of test circuit blocks provided, statistical statements are determined regarding the reliability of the gate insulation layers in the second sub-circuit blocks, whereby the meaningful content of the information obtained is considerably improved. This new assessment criterion for the reliability of a gate insulation layer in particular for a thin dielectric is directly product-relevant.

Preferred refinements of the invention emerge from the dependent claims.

In accordance with one refinement of the invention, the gate insulation layer of the first field effect transistor is at least a factor of 1.2, particularly preferably a factor of 1.3, thicker than the gate insulation layer of the second field effect transistor.

This dimensioning of the layer thicknesses of the gate insulation layer of the first field effect transistor and of the second field effect transistor, respectively, ensures that the lifetime of the first field effect transistor is at least a factor of 1000 greater than the lifetime of the second field effect transistor, which statistically dependently ensures that essentially only the gate insulation layer of the second field effect transistor breaks down in each case given corresponding stressing by an operating voltage present at the electronic switching circuit. This ensures that the first sub-circuit block represents a reliable stress source for the second sub-circuit block for the signal conditioning of the test input signal.

In accordance with one refinement of the invention, the layer thickness of the gate insulation layer of the second field effect transistor is less than 5 nm, particularly preferably less than 2 nm. The invention is suitable in particular for so-called thin oxide field effect transistors since the above-described problem area of the statistically occurring breakdowns of a gate oxide in a field effect transistor and the only small increase in the leakage current in the event of a gate dielectric breakdown occurring acquires particular importance in that case.

In the case where the gate insulation layer of the second field effect transistor has a layer thickness of 5 nm, the first field effect transistor thus preferably has a gate insulation layer having at least a thickness of 6 nm. In the case where the gate insulation layer of the second field effect transistor has a layer thickness of 2 nm, the gate insulation layer of the first field effect transistor preferably has a layer thickness of at least 2.4 nm.

The field effect transistors may be MOS field effect transistors (Metal Oxide Semiconductor field effect transistors), particularly preferably CMOS field effect transistors (Complementary Metal Oxide Semiconductor field effect transistors).

In the case of silicon-based field effect transistors the gate insulation layers are preferably formed from oxide material, particularly preferably from silicon dioxide, alternatively from a dielectric having a relatively high dielectric constant such as, for example, one or more transition metal oxides, e.g. aluminum oxide ($Al_2O_3$), hafnium oxide ($HfO_2$) and the silicates thereof.

In accordance with one refinement of the invention, it is provided that the at least one first sub-circuit block and the at least one second sub-circuit block in the respective test circuit block are coupled in series with one another.

The at least one first sub-circuit block and/or the at least one second sub-circuit block contain/contains at least one inverter.

By virtue of the provision of at least one inverter in the first sub-circuit block and in the second sub-circuit block, it is ensured by virtue of the respective signal inversion in each sub-circuit block that, on the one hand, a signal processing is carried out in the test circuit block, but also, on the other hand, that the respective partial output signal present at the output of the respective test circuit block has the same polarity as the partial input signal present at the respective test circuit block.

Furthermore, the provision of inverters makes it possible readily also to detect the changeover from a first signal level to a second signal level, for example a transition from a level of 3 volts, generally a high level, to a level of 0 volts, generally a low level, and vice versa.

In accordance with one refinement of the invention, the first sub-circuit block comprises a first inverter, in which both field effect transistors, that is to say a PMOS field effect transistor and an NMOS field effect transistor, have thick gate insulation layers, that is to say thick gate oxides. In accordance with this refinement of the invention, it is provided that the second sub-circuit block of each test circuit block is formed from precisely one inverter, the respective NMOS field effect transistor and the respective PMOS field effect transistor having a thin gate oxide layer, generally a thin gate insulation layer, preferably having a thickness of at most 5 nm.

Preferably, the second sub-circuit block is connected downstream of the first sub-circuit block in the respective test circuit block.

Clearly, the multiplicity of test circuit blocks comprising the two sub-circuit blocks with an inverter in each case form a buffer chain enabling product-close assessment of the reliability of the gate insulation layers in integrated logic circuits. To put it another way, this means that each test circuit block has a two-stage inverter, preferably a two-stage CMOS inverter, in which the first inverter stage is embodied with a thicker gate oxide and the second inverter stage is embodied with the thinner gate oxide to be assessed, that is to say to be tested, or a gate dielectric having a high dielectric constant. The two inverter chains having different oxide thicknesses, that is to say a first inverter chain formed from the first sub-circuit blocks and a second inverter chain formed from the second sub-circuit blocks, are preferably connected up such that they are interleaved in one another.

In the second inverter stage, the gate oxide that is actually to be tested is loaded, that is to say stressed. The first inverter stage connected upstream represents a product-like driving of the tested inverter stage, thereby ensuring the product relevance of the results determined in the context of the testing of the electronic switching circuit. The first sub-circuit block furthermore has the task of compensating for the inverter function of the second inverter stage without itself contributing significantly to the breakdown distribution, that is to say to the statistical distribution of the occurrence of breakdowns in the gate insulation layers. This is achieved by virtue of the fact that the first inverter stage is embodied in a thicker gate oxide. The requisite technology is provided in standard processes in technology generations that are customary at the present time.

The level inversion, that is to say the inversion of the respective electrical voltage which is present at the respective sub-circuit block, by the first inverter stage ensures that each inverter stage comprising transistors with a thin gate oxide is stressed with the same electrical voltage. Consequently, depending on the application of the input voltage to the first inverter stage, that is to say depending on the chosen level of the applied input voltage, all the NMOS field effect transistors or all the PMOS field effect transistors can optionally be selected for loading.

The buffer chain clearly represents a simple integrated circuit at which a desired logical basic function can be tested.

In one refinement of the switching circuit test arrangement according to the invention it is provided that the amplitude of the operating voltage can be varied. In this case, the test output signal evaluation unit is set up in such a way that it can determine the minimum amplitude of the operating voltage for which the electronic switching circuit is still operative.

By variation of the amplitude of the operating voltage present at the electronic switching circuit, a new assessment criterion is specified for the reliability, in particular for dielectrics, which criterion is directly product-relevant. Consequently, according to the invention, a function is determined which specifies the lowest operating voltage, that is to say the minimum supply voltage, at which the respective logical function of the test circuit blocks is still implemented correctly, as a function of the stress loading.

As an alternative it is provided that the operating voltage source is set up in such a way that the frequency of the operating voltage can be varied and that the test output signal evaluation unit is set up in such a way that the frequency of the operating voltage that is respectively present is used to determine the frequency at which the electronic switching circuit is still operative.

According to the invention, it is also the case that the area restriction as in accordance with the prior art no longer holds true since the breakdown current is no longer assessed in relation to the leakage current under stress conditions. Rather, the logical function can be assessed at an inverter chain of arbitrary length, and the structure should merely be connected with no resistance, so that the same stress voltage is present at each device, that is to say preferably at each field effect transistor with a thin gate insulation layer.

In a corresponding manner, for the method according to the invention in one refinement of the invention, it is provided that the amplitude of an applied operating voltage is varied to determine the minimum operating voltage starting from which or at which the electronic switching circuit is operative.

As an alternative, it is provided that the frequency of an applied operating voltage is varied to determine whether the electronic switching circuit is operative.

Clearly, the invention can be seen in the fact that thick oxide inverters and thin oxide inverters are combined to form buffer chains for examining the reliability of thin dielectrics, that is to say of thin oxides.

Unlike in conventional circuit elements, the buffer chain according to the invention permits the targeted loading of NMOS field effect transistors or PMOS field effect transistors under a product-like environment, solves the restriction of the area limitation in the case of thin dielectrics in accordance with the prior art and, with the assessment of the logical function or the operativeness of the test circuit blocks, represents a product-relevant assessment criterion.

The electronic switching circuit can be integrated on a wafer, for example in an electronic chip to be formed, alternatively in a sawing kerf of a wafer in which a multiplicity of electronic chips are fabricated.

Exemplary embodiments of the invention are illustrated in the FIG.s and are explained in more detail below. Identical or similar components are provided with identical reference symbols, if appropriate, in the FIG.s.

DETAILED DESCRIPTION

Figure 2:
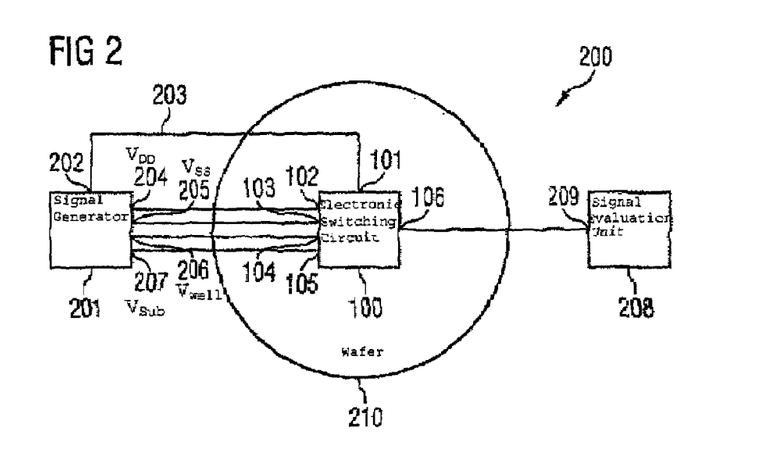
FIG. 2 shows a switching circuit test arrangement in accordance with a first exemplary embodiment of the invention.

FIG. 2 shows a switching circuit test arrangement 200 in accordance with a first exemplary embodiment of the invention.

The switching circuit test arrangement 200 for determining the operativeness of an electronic switching circuit 100 has a signal generator 201 for generating an electrical test signal and also for providing an operating voltage.

At a first output 202, a test signal 203 is provided by the signal generator 201 and fed to a test signal input terminal 101 of the electronic switching circuit 100, which is coupled to the first output terminal 202 of the signal generator 201.

Furthermore, the signal generator 201 has four operating voltage terminals 204, 205, 206, 207, a first operating potential $V_{DD}$ being provided at a first operating voltage terminal 204, a second operating potential $V_{SS}$ being provided at a second operating voltage terminal, a well potential $V_{well}$ being provided at a third operating voltage terminal 206, and a substrate potential $V_{sub}$ being provided at a fourth operating voltage terminal 207.

The four operating voltage terminals 204, 205, 206, 207 of the signal generator 201 are coupled to four associated input terminals 102, 103, 104 and 105, respectively.

Furthermore, the switching circuit test arrangement 200 has a test output signal evaluation unit 208, set up as a personal computer, which is coupled to a test signal output terminal 106 of the electronic switching circuit 100 by means of an input/output interface 209.

The electronic switching circuit 100 to be tested is integrated in an electronic chip (not shown) of a wafer 210 in accordance with this exemplary embodiment.

As an alternative, it is provided that the electronic switching circuit 100 is arranged in a sawing kerf of the wafer 210.

Figure 1:
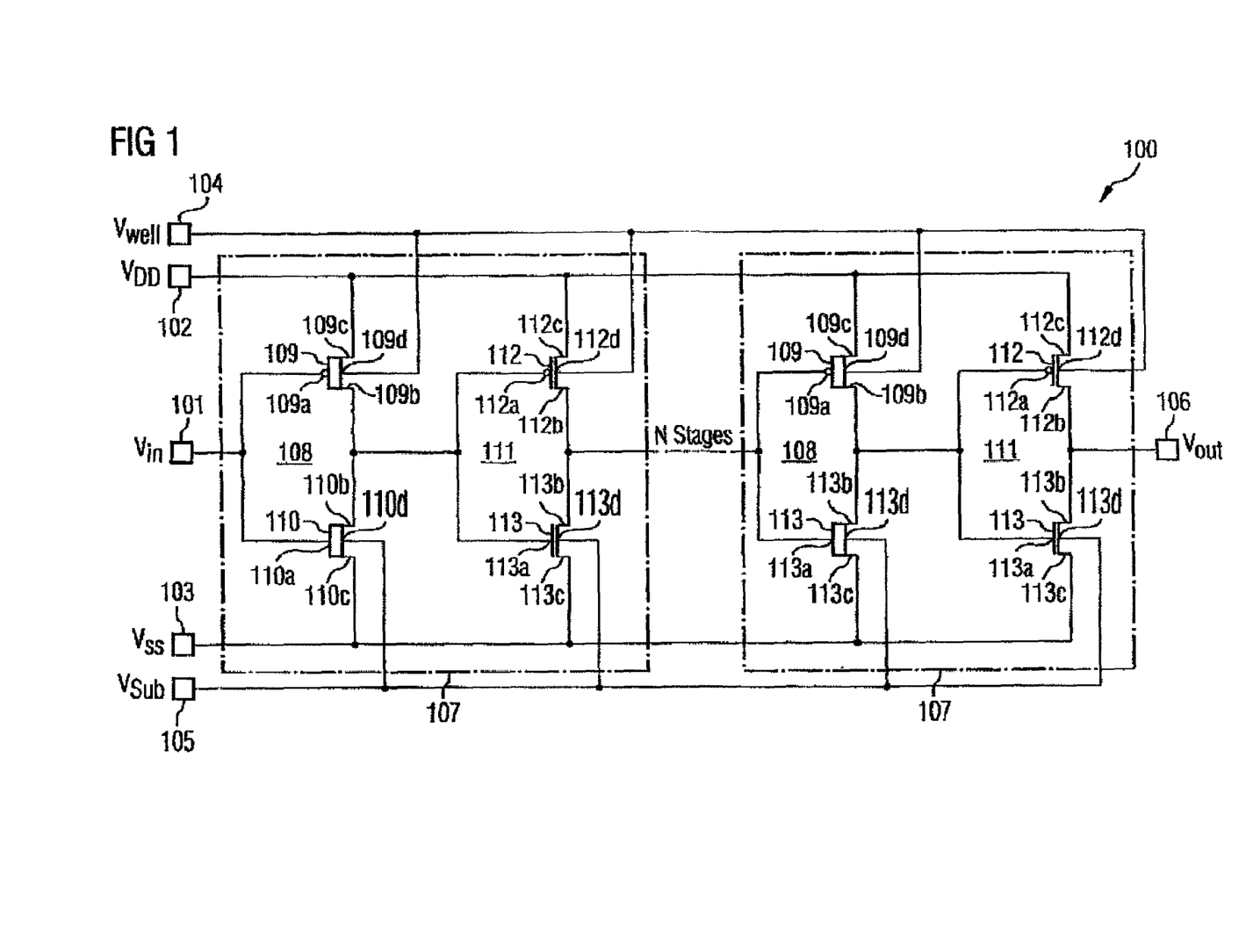
FIG. 1 shows an electronic switching circuit to be tested in accordance with a first exemplary embodiment of the invention.

The construction of the electronic switching circuit 100 to be examined is described in more detail below with reference to FIG. 1.

The electronic switching circuit 100 to be tested has N inverter stages connected in series, in each case two inverter stages arranged directly adjacent to one another forming an inverter stage pair 107 as test circuit block. This means that N/2 inverter stage pairs 107 are provided in the electronic circuit 100 to be tested.

A first inverter stage 108 of each inverter stage pair 107 has a PMOS field effect transistor 109 and also an NMOS field effect transistor 110, the gate oxides, that is to say the silicon dioxide layers for insulating the gate layer of the respective field effect transistor from the channel region thereof, having a thickness of 6 nm. To put it another way, this means that the first inverter stage is formed from field effect transistors with thick gate oxide.

Connected downstream of the first inverter stage 108 in each case in the signal flow direction in an inverter stage pair 107 is a second inverter stage 111, which likewise has a PMOS field effect transistor 112 and an NMOS field effect transistor 113.

The gate oxide layer, that is to say the silicon dioxide layer in accordance with this exemplary embodiment of the invention of the two field effect transistors 112, 113 for insulating the gate layer from the channel region of the respective field effect transistors 112, 113 has a thickness of 5 nm in accordance with this exemplary embodiment of the invention.

The gate terminals 109a, 110a of the two field effect transistors 109, 110 of the first inverter stage 108 are coupled to the test signal input terminal 101, so that the test signal generated by the signal generator 201 is applied directly to the gate terminals 109a, 110a of the field effect transistors 109, 110 of the first inverter stage 108.

A first source-drain terminal 109b of the PMOS field effect transistor 109 of the first inverter stage 108 is coupled to a first source-drain terminal 110b of the NMOS field effect transistor 110 of the first inverter stage.

A first source-drain terminal 112b of the PMOS field effect transistor 112 of the second inverter stage 111 is coupled to a first source-drain terminal 113b of the NMOS field effect transistor 113 of the second inverter stage 111.

All the second source-drain terminals 109c, 112c of all the PMOS field effect transistors 109, 112 of all the inverter stages 108, 111 is coupled to the first operating voltage terminal 102 of the electronic switching circuit 100 to be tested, so that the first operating potential $V_{DD}$ is applied to the respective first source-drain terminal 109c, 112c of the PMOS field effect transistor 109, 112 of the electronic switching circuit 100.

Furthermore, the well terminals 109d, 112d of all the PMOS field effect transistors 109 and 112 of all the inverter stages 108, 111 are coupled to the third operating voltage terminal 104 of the electronic switching circuit 100, so that the respective well potential $V_{well}$ is applied to the respective well terminal 109d, 112d of a PMOS field effect transistor 109d, 112d of all the inverter stages 108, 111 of the electronic switching circuit 100.

All the second source-drain terminals 110c, 113c of all the NMOS field effect transistors 110, 113 of all the inverter stages 108, 111 are coupled to the second operating voltage terminal 103. Consequently, the second operating potential $V_{ss}$ is applied to the respective second source-drain terminal 110c, 113c of each NMOS field effect transistor 110, 113.

The substrate terminals 110d, 113d of all the NMOS field effect transistors 110, 113 of all the inverter stages 108, 111 are coupled to the fourth operating voltage terminal 105, so that the substrate potential $V_{sub}$ is applied to the respective substrate terminal 110d of each NMOS field effect transistor 110, 113.

The two gate terminals 112a, 113a of the two field effect transistors 112, 113 of the second inverter stage 111 are coupled to the first source-drain terminal 109b of the PMOS field effect transistor 109 of the first inverter stage 108 and also to the first source-drain terminal 110b of the NMOS field effect transistor 110 of the first inverter stage 108.

In a corresponding manner, the other inverter stage pairs 107 are coupled to the operating voltage terminals 102, 103, 104, 105 and connected in series with one another, so that in each case the two gate terminals 109a, 110a of the field effect transistors 109, 110 of the first inverter stage 108 are coupled to the two first source-drain terminals 112b, 113b of the field effect transistors of the second inverter stage 111 of the respectively preceding inverter stage pair 107 in the signal flow direction.

The first source-drain terminals 112b, 113b of the field effect transistors 112, 113 of the second inverter stage 111 of the last inverter stage pair 107 in the signal flow direction within the electronic switching circuit 100 is coupled to the test signal output terminal 106, at which a test signal output voltage $V_{out}$ is provided by the electronic switching circuit 100.

It should be noted in this context that the electronic switching circuit 100 may have an arbitrary number of inverter stage pairs 107 and thus an arbitrary even number of n inverter stages, that is to say N=2, 10, 100, 1000, 10000 . . . , where N denotes the number of inverter stages in the electronic switching circuit 100. Furthermore, it should be pointed out that, preferably, the dimensioning of the NMOS field effect transistors 113 of the second inverter stage 111 and of the PMOS field effect transistors 112 of the second inverter stage 111, that is to say the NMOS field effect transistors 113 and PMOS field effect transistors 112 of the thin oxide inverters are different; they preferably have a small width with different lengths.

Figure 3:
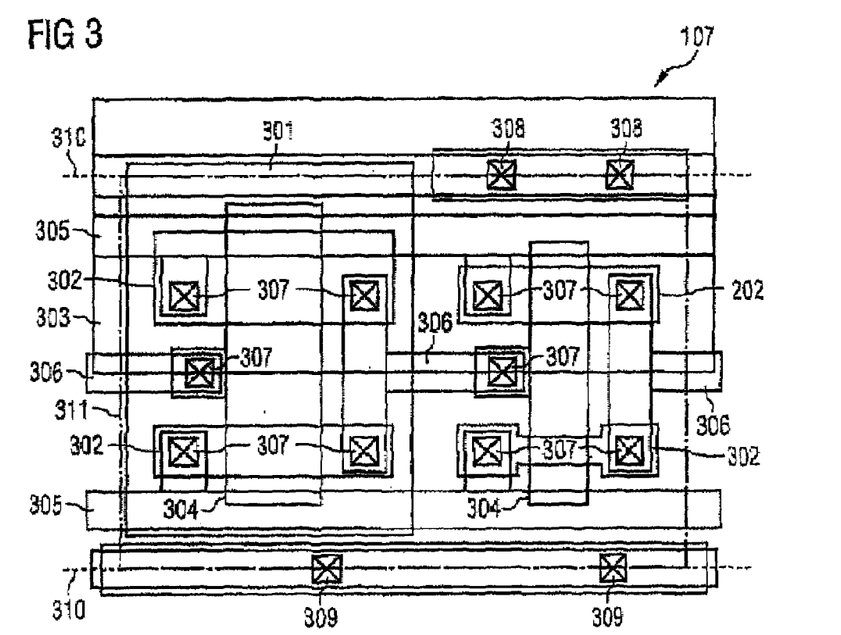
FIG. 3 shows a schematic layout illustration of an inverter stage of a switching circuit to be examined in accordance with FIG. 1.

FIG. 3 shows a schematic layout illustration of an inverter stage pair 107 comprising a first inverter stage 108 and a second inverter stage 111.

The first inverter stage 108 is illustrated in the left-hand half and the second inverter stage 111 in the right-hand half of FIG. 3. The region with thick oxide, that is to say with a gate oxide layer having a thickness of 6 nm, is designated by the reference symbol 301 in FIG. 3.

The active regions of the field effect transistors 109, 110, 112, 113 are provided with the reference symbol 302.

The N-type well for the PMOS field effect transistors 109, 112 of the inverter stage pair 107 is provided with the reference symbol 303.

The regions made of polysilicon are designated by the reference symbol 304.

The interconnects of the first metalization plane to which the source-drain terminals of the field effect transistors are connected are designated by the reference symbol 305.

The interconnects of the second metalization plane M2 to which the gate terminals of the field effect transistors are connected are provided with the reference symbol 306.

The reference symbol 307 designates the contact holes for contact-connecting the interconnects to the gate terminals and the source-drain terminals of the field effect transistors.

The reference symbol 308 designates the contact holes for contact-connecting the N-type well.

The reference symbol 309 designates the contact holes for contact-connecting the NMOS field effect transistors, that is to say, in particular, the substrate terminals of the NMOS field effect transistors to the substrate. Reference symbol 310 designates the axis of symmetry of a unit cell 311 formed by the inverter stage pair 107 in the layout.

The signal generator 201 in each case applies an electronic test signal of a predetermined test signal profile to the gate terminals 109a, 110a of the field effect transistors 109, 110 of the first inverter stage 108.

The first operating potential $V_{DD}$ is varied by the signal generator 201. The first operating voltage terminal 102 to which the first operating potential $V_{DD}$ that is to say, the voltage supply, is fed to the electronic switching circuit 100, clearly represents the stress pin, that is to say the terminal via which the stress current which is intended to stress the field effect transistors with thin gate oxides that are to be tested and to be stressed is fed in.

According to the invention, the first operating potential $V_{DD}$ is varied and in each case after stressing has been effected, the test output signal evaluation unit 208 is used to determine the minimum supply voltage, that is to say minimum operating voltage, at which the logical function realized by the inverter stages 108, 111 is still implemented correctly.

If the minimum supply voltage rises above a predeterminable voltage threshold dependent on the process technologies, then this means that the leakage currents in the field effect transistors become too large, which ultimately indicates the occurrence of breakdowns in the gate oxides of the field effect transistors with thin gate oxides.

It should be noted in this context that the specific voltage thresholds may be different for each wafer and is dependent on the materials used and the production processes used. The voltage thresholds are thus to be determined empirically for each wafer and the test output signal evaluation unit 208 is to be correspondingly calibrated or set.

Figure 4A:
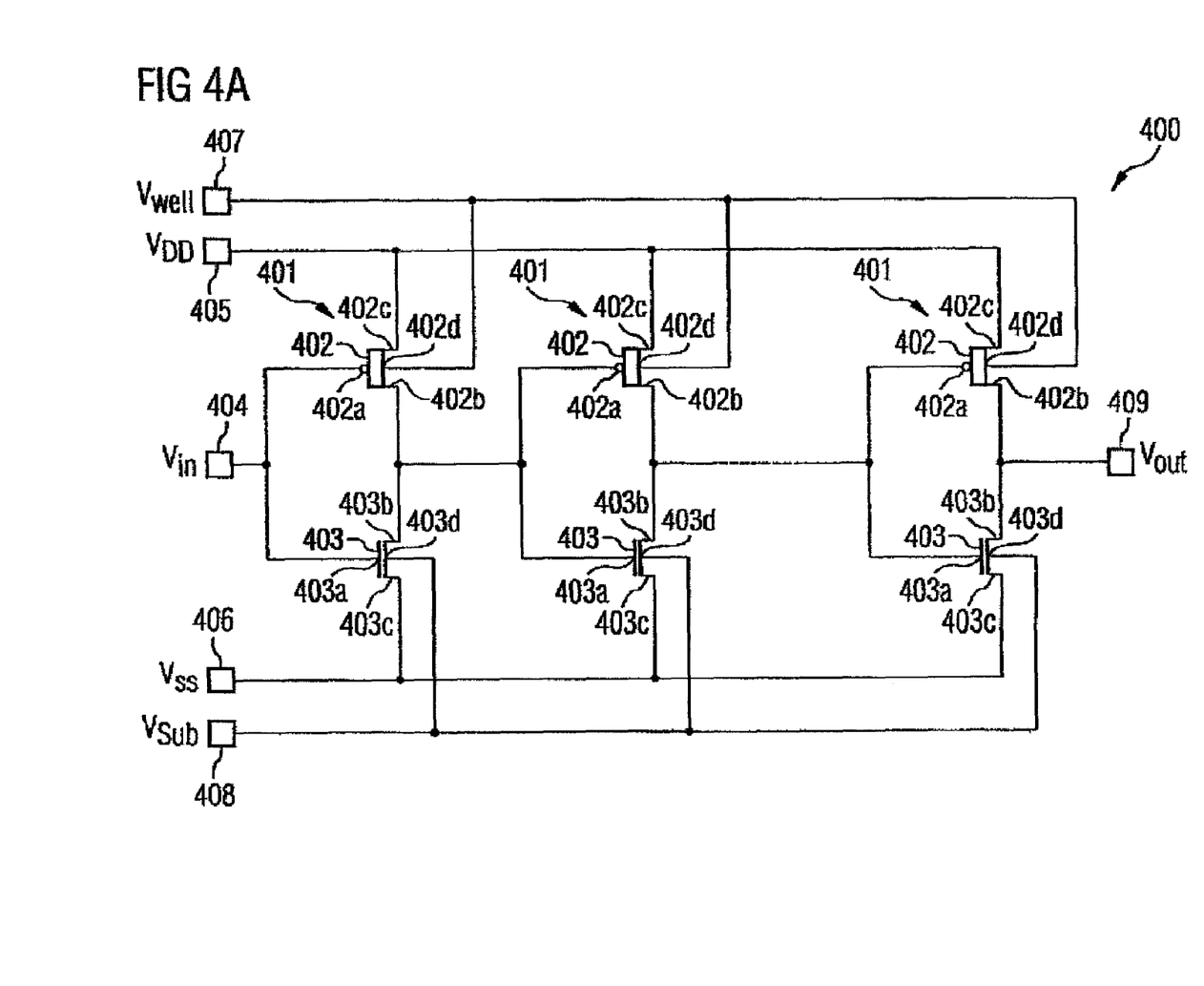
FIGS. 4A and 4B show electronic switching circuits to be tested in accordance with a second exemplary embodiment of the invention.
Figure 4B:
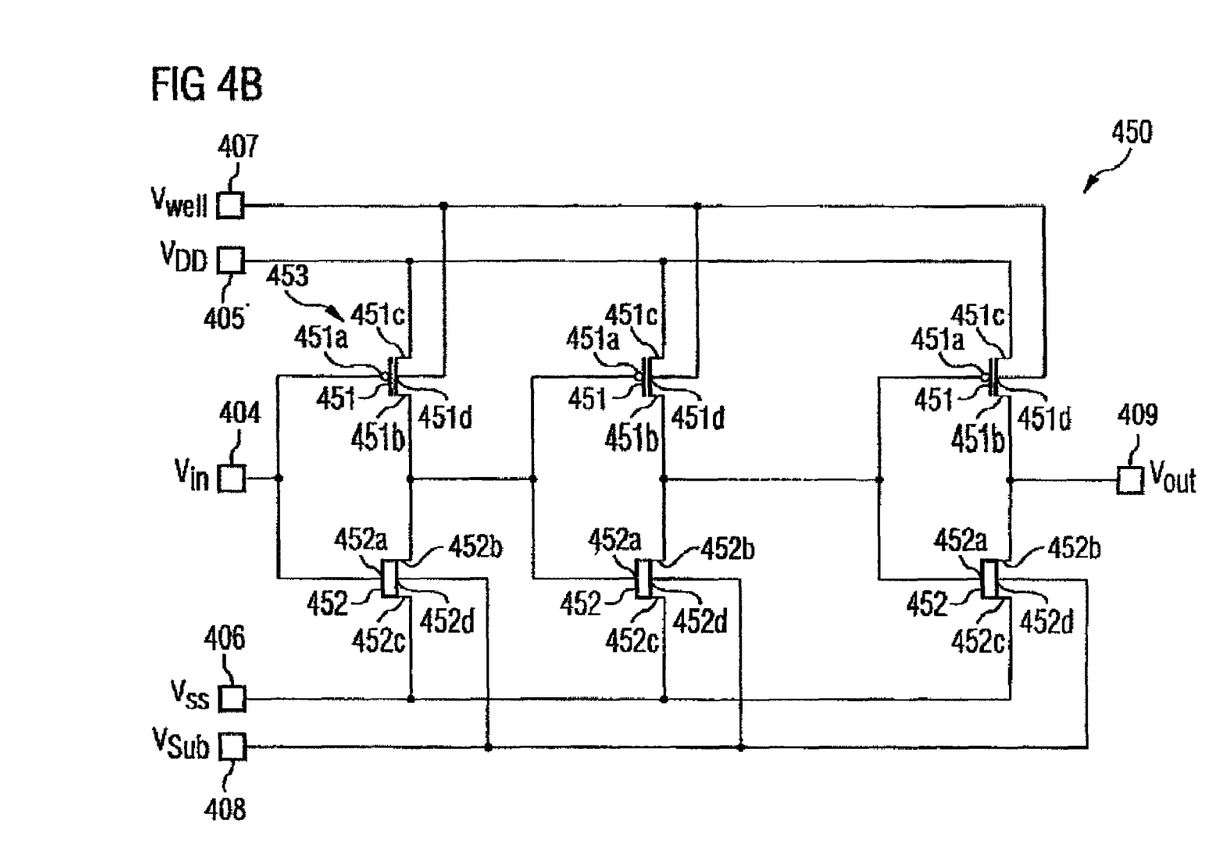

FIG. 4a and FIG. 4b illustrate two electronic switching circuits 400, 450 in accordance with a second exemplary embodiment of the invention.

In contrast to the electronic switching circuit 100 in accordance with the first exemplary embodiment of the invention, the first electronic switching circuit 400 in accordance with the second exemplary embodiment of the invention has identical inverter stages 401 each having a PMOS field effect transistor 402 with a thick gate oxide, that is to say with a gate oxide having the thickness of 6 nm, and also an NMOS field effect transistor 403 with a gate oxide layer having the thickness of 5 nm, that is to say with a thin gate oxide.

The interconnection is identical to the interconnection of the inverter stages in accordance with the first exemplary embodiment of the invention, that is to say that the gate terminals 402a, 403a of the field effect transistors 402, 403 are coupled to a test signal input terminal 404. The first source-drain terminals 402b, 403b of the field effect transistors 402, 403 are connected to one another and also to the gate terminals 402a, 403a of the downstream field effect transistors 402, 403 of the next inverter stage 401 in the signal flow direction.

The second source-drain terminal of the PMOS field effect transistor 402a with a thick gate oxide is in each case coupled to a first operating voltage terminal 405, to which the first operating potential $V_{DD}$ is applied.

The second source-drain terminal 403c of the NMOS field effect transistor 403 with a thin gate oxide of each inverter stage 401 is coupled to a second operating voltage terminal 406, to which a second operating potential $V_{ss}$ is applied.

The well terminal 402d of each PMOS field effect transistor 402 is coupled to a third operating voltage terminal 407, to which the well potential $V_{well}$ is applied.

The substrate terminal 403d of each NMOS field effect transistor 403 of the inverters 401 is coupled to a fourth operating voltage terminal 408, to which the substrate potential $V_{sub}$ is applied.

The determination of the reliability of the gate dielectrics is carried out in a manner corresponding to that in accordance with the first exemplary embodiment by means of a signal generator (not shown) and a corresponding test output signal evaluation unit.

The first source-drain terminals 402b, 403b of the field effect transistors 402, 403 of the last inverter stage 401 in the signal flow direction in the electronic switching circuit 400 are coupled to a test signal output terminal 409, at which the test output signal $V_{out}$ is provided.

The field effect transistors to be tested are the NMOS field effect transistors 403 in accordance with this exemplary embodiment of the invention.

In accordance with the second exemplary embodiment of the invention, a second electronic switching circuit 450 such as is illustrated in FIG. 4b is provided for testing gate oxides of PMOS field effect transistors.

The circuit structure is identical to that of the first electronic switching circuit 400 in accordance with FIG. 4a, with the difference that, in this case, the PMOS field effect transistors 451 is provided as transistors with thin gate oxide, that is to say with a gate oxide having the thickness of 5 nm, and the NMOS field effect transistors 502 are formed with a thickness of the respective gate oxide layer of 6 nm, that is to say with a thick gate oxide.

The gate terminals 451a, 452a of the field effect transistors 451, 452 are coupled, in the case of the first inverter 453, to the test signal input terminal 404, and in the case of the downstream inverter stages, to the two first source-drain terminals 451b, 452b of the field effect transistors 451, 452 of the respectively preceding inverter 453 in the signal flow direction.

The second source-drain terminal 451c of each PMOS field effect transistor 451 is in each case coupled to the second operating voltage terminal 405 and the second source-drain terminal 452c of each NMOS field effect transistor 452 is coupled to the third operating voltage terminal 406.

The well terminal 451 of each PMOS field effect transistor 451 is coupled to the third operating voltage terminal 407 and the substrate terminal 452d of each NMOS field effect transistor 452 is coupled to the fourth operating voltage terminal 408.

The first source-drain terminals 451b, 452b of the last inverter 453 in the signal flow direction are coupled to the test signal output terminal 409.

The invention claimed is:

1. A switching circuit test arrangement for determining the operativeness of an electronic switching circuit, the switching circuit comprising:
   a test signal input terminal for application of a test input signal;
   a test signal output terminal, at which a test output signal can be provided;
   a multiplicity of test circuit blocks, each test circuit block having at least one first sub-circuit block and at least one second sub-circuit block, the test circuit blocks being connected between the test signal input terminal and the test signal output terminal, such that the functionality of the test circuit blocks can be tested by means of the test input signal,
   wherein the at least one first sub-circuit block includes at least one first field effect transistor having a gate insulation layer,
   wherein the at least one second sub-circuit block includes at least one second field effect transistor having a gate insulation layer, and
   wherein the gate insulation layer of the first field effect transistor is thicker than the gate insulation layer of the second field effect transistor, such that the at least one first field effect transistor is configured as a driver of the second field effect transistor
   and further comprising
   a test input signal generating unit for generating a test input signal to be fed to the test signal input terminal;
   a test output signal evaluation unit for determining the operativeness of the electronic switching circuit; and
   an operating voltage source for providing an operating voltage.

2. The switching circuit test arrangement as claimed in claim 1, wherein the gate insulation layer of the at least one first field effect transistor is at least a factor of 1.2 thicker than the gate insulation layer of the at least one second field effect transistor.

3. The switching circuit test arrangement as claimed in claim 1, wherein the layer thickness of the gate insulation layer of the at least one second field effect transistor is less than 6 nm.

4. The switching circuit test arrangement as claimed in one of claims 1, wherein the layer thickness of the gate insulation layer of the at least one first field effect transistor is greater than 10 nm.

5. The switching circuit test arrangement as claimed in claim 1, wherein the at least one first field effect transistors and the at least one second field effect transistor comprise MOS field effect transistors.

6. The switching circuit test arrangement as claimed in claim 5, wherein the at least one first field effect transistor and the at least one second field effect transistor comprise CMOS field effect transistors.

7. The switching circuit test arrangement as claimed in claim 1, wherein the gate insulation layers of the first and second field effect transistors have oxide material.

8. The switching circuit test arrangement as claimed in claim 7, wherein the gate insulation layers of the first and the second field effect transistors comprises one of silicon dioxide, at least one transition metal oxides or the silicates of the at least one transition metal oxide.

9. The switching circuit test arrangement as claimed in claim 1, wherein the at least one first sub-circuit block and the at least one second sub-circuit block in the respective multiplicity of test circuit blocks are coupled in series with one another.

10. The switching circuit test arrangement as claimed in claim 9, in which the at least one first sub-circuit block or the at least one second sub-circuit block includes at least one inverter.

11. The switching circuit test arrangement as claimed in claim 9, in which the at least one first sub-circuit block and the at least one second sub-circuit block include at least one inverter.

12. The switching circuit test arrangement as claimed in claim 9, wherein the at least one second sub-circuit block is connected downstream of the at least one first sub-circuit block in the respective multiplicity of test circuit blocks.

13. The switching circuit test arrangement as claimed in claim 1, wherein the operating voltage source is configured to vary the amplitude of the operating voltage, and wherein the test output signal evaluation unit is configured to determine the minimum amplitude of the operating voltage for which the electronic switching circuit is operative.

14. The switching circuit test arrangement as claimed in claim 1, wherein the operating voltage source is configured to vary the frequency of the operating voltage.

15. A method for determining the operativeness of an electronic switching circuit, the switching circuit comprising:
   a test signal input terminal for application of a test input signal,
   a test signal output terminal, at which a test output signal can be provided,
   a multiplicity of test circuit blocks, each test circuit block having at least one first sub-circuit block and at least one second sub-circuit block,
   the test circuit blocks being connected between the test signal input terminal and the test signal output terminal, such that the functionality of the test circuit blocks can be tested by means of the test input signal,
   the first sub-circuit block including at least one first field effect transistor having a gate insulation layer,
   the second sub-circuit block including at least one second field effect transistor having a gate insulation layer,
   the gate insulation layer of the at least one first field effect transistor being thicker than the gate insulation layer of the at least one second field effect transistor,
and further comprising:
   a test input signal generating unit for generating a test input signal to be fed to the test signal input terminal;
   a test output signal evaluation unit for determining the operativeness of the electronic switching circuit; and
   an operating voltage source for providing an operating voltage the method comprising:
   applying a test input signal to the test signal input terminal, wherein an associated test output signal is tapped off at the test signal output terminal; and
   using the test output signal by using the output signal evaluation unit to determine whether the electronic switching circuit is operative.

16. The method as claimed in claim 15 further comprising applying an operating voltage, wherein an amplitude of the applied operating voltage is varied to determine a minimum operating voltage starting from which the electronic switching circuit is operative.

17. The method as claimed in claim 15 further comprising applying an operating voltage, wherein a frequency of the applied operating voltage is varied to determine whether the electronic switching circuit is operative.

* * * * *